(12) United States Patent
Chang et al.

(10) Patent No.: US 9,627,268 B2
(45) Date of Patent: Apr. 18, 2017

(54) METHOD FOR FABRICATING SEMICONDUCTOR DEVICE

(71) Applicant: UNITED MICROELECTRONICS CORP., Hsin-Chu (TW)

(72) Inventors: Ching-Yu Chang, Taipei (TW); Li-Wei Feng, Kaohsiung (TW); Shih-Hung Tsai, Tainan (TW); Ssu-I Fu, Kaohsiung (TW); Jyh-Shyang Jenq, Pingtung County (TW); Chien-Ting Lin, Hsinchu (TW); Yi-Ren Chen, Kaohsiung (TW); Shou-Wei Hsieh, Hsin-Chu (TW); Hsin-Yu Chen, Nantou County (TW); Chun-Hao Lin, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/884,746

(22) Filed: Oct. 15, 2015

(65) Prior Publication Data

US 2017/0069543 A1 Mar. 9, 2017

(30) Foreign Application Priority Data

Sep. 3, 2015 (TW) .............................. 104129113 A

(51) Int. Cl.
*H01L 21/8238* (2006.01)
*H01L 21/324* (2006.01)

(52) U.S. Cl.
CPC .... *H01L 21/823814* (2013.01); *H01L 21/324* (2013.01); *H01L 21/823821* (2013.01); *H01L 21/823878* (2013.01)

(58) Field of Classification Search
CPC ................ H01L 21/823425; H01L 21/823821
See application file for complete search history.

(56) References Cited

U.S. PATENT DOCUMENTS

| 6,093,610 A | 7/2000 | Rodder |
| 7,955,928 B2 | 6/2011 | Chan et al. |
| 2009/0035909 A1* | 2/2009 | Chang ............. H01L 21/823807 438/276 |
| 2013/0102137 A1* | 4/2013 | Jeng .................... H01L 21/2255 438/548 |
| 2013/0122676 A1* | 5/2013 | Jeng ................ H01L 21/823431 438/306 |

OTHER PUBLICATIONS

Feng, Title of Invention: Semiconductor Device and Method for Fabricating the Same, U.S. Appl. No. 14/637,400, filed Mar. 4, 2015.

* cited by examiner

*Primary Examiner* — Yu-Hsi D Sun
(74) *Attorney, Agent, or Firm* — Winston Hsu; Scott Margo

(57) ABSTRACT

A method for fabricating semiconductor device is disclosed. The method includes the steps of: providing a substrate having a fin-shaped structure thereon and a shallow trench isolation (STI) around the fin-shaped structure, in which the fin-shaped structure has a top portion and a bottom portion; forming a first doped layer on the STI and the top portion; and performing a first anneal process.

5 Claims, 8 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to an approach of utilizing solid state doping (SSD) technique to form doped region on the top portion of fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate having a fin-shaped structure thereon and a shallow trench isolation (STI) around the fin-shaped structure, in which the fin-shaped structure has a top portion and a bottom portion; forming a first doped layer on the STI and the top portion; and performing a first anneal process.

According to another aspect of the present invention, a method for fabricating semiconductor device is disclosed. The method includes the steps of: providing a substrate having a first region and a second region; forming a first fin-shaped structure on the first region and a second fin-shaped structure on the second region; forming a shallow trench isolation (STI) around the first fin-shaped structure and the second fin-shaped structure so that each of the first fin-shaped structure and the second fin-shaped structure is divided into a top portion and a bottom portion; forming a first doped layer on the STI and the top portion of the second fin-shaped structure; forming a second doped layer on the STI and the top portion of the first fin-shaped structure; and performing a first anneal process.

According to another aspect of the present invention, a method for fabricating semiconductor device is disclosed. The method includes the steps of: providing a substrate having a first region and a second region; forming a first fin-shaped structure on the first region and a second fin-shaped structure on the second region; forming a shallow trench isolation (STI) around the first fin-shaped structure and the second fin-shaped structure so that each of the first fin-shaped structure and the second fin-shaped structure is divided into a top portion and a bottom portion; forming a first doped layer on the STI and on the top portion of the second fin-shaped structure; forming a second doped layer on the STI and the top portion of the first fin-shaped structure, in which the first doped layer and the second doped layer comprise dopants of same type; and performing an anneal process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
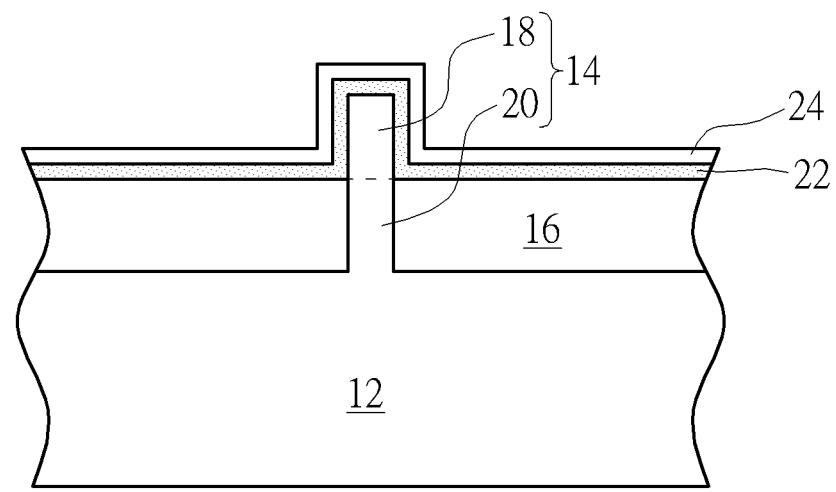
FIGS. 1-5 illustrate a method for fabricating semiconductor device according to a first embodiment of the present invention.

Referring to FIGS. 1-5, FIGS. 1-5 illustrate a method for fabricating semiconductor device according to a first embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a fin-shaped structure 14 is formed on the substrate 12 and a shallow trench isolation (STI) 16 is formed around the fin-shaped structure 14.

The formation of the fin-shaped structures 14 could be accomplished by first forming a patterned mask (now shown) on the substrate, 12, and an etching process is performed to transfer the pattern of the patterned mask to the substrate 12. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structures 14. Moreover, if the substrate 12 were a SOI substrate, a patterned mask could be used to etch a semiconductor layer on the bottom oxide layer without etching through the semiconductor layer for forming the fin-shaped structure 14.

The formation of the STI 16 could be accomplished by first depositing an insulating material (not shown) composed of silicon oxide on the substrate 12 to cover the fin-shaped structure 14, and a planarizing process such as chemical mechanical polishing (CMP) process is conducted to remove part of the insulating material or even part of the fin-shaped structure 14 so that the top surface of the remaining insulating material is even with the top surface of the fin-shaped structure 14 to form a STI 16. An etching process is then conducted thereafter to remove part of the STI 16 so that the top surface of the STI 16 is slightly lower than the top surface of the fin-shaped structure 14. This divides the fin-shaped structure 14 into a top portion 18 and a bottom portion 20, in which the top surface of the STI 16 is even with the bottom surface of the top portion 18 of fin-shaped structure 14.

Next, a doped layer 22 is formed to cover the STI 16 and the top portion 18 of fin-shaped structure 14, and a liner 24 or cap layer could be selectively formed on the doped layer 22. In this embodiment, the liner 24 is preferably composed of silicon nitride, and the material of the doped layer 22 could be adjusted depending on the type of transistor being fabricated afterwards. For instance, if a PMOS transistor were to be fabricated, the doped layer 22 is preferably composed of thin film containing p-type dopants, such as borosilicate glass (BSG). Conversely, if a NMOS transistor were to be fabricated, the doped layer 22 is preferably composed of thin film containing n-type dopants, such as phosphosilicate glass (PSG).

Figure 2:
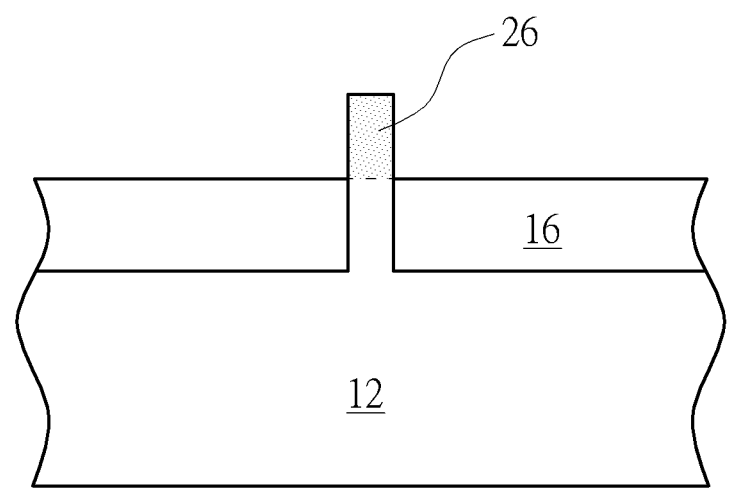

Next, as shown in FIG. 2, an anneal process is conducted to drive dopants within the doped layer 22 into the top portion 18 for forming a doped region 26, in which the doped region 26 could be used to adjust the threshold voltage of the entire device. The liner 24 and the doped layer 22 are removed thereafter.

Figure 3:
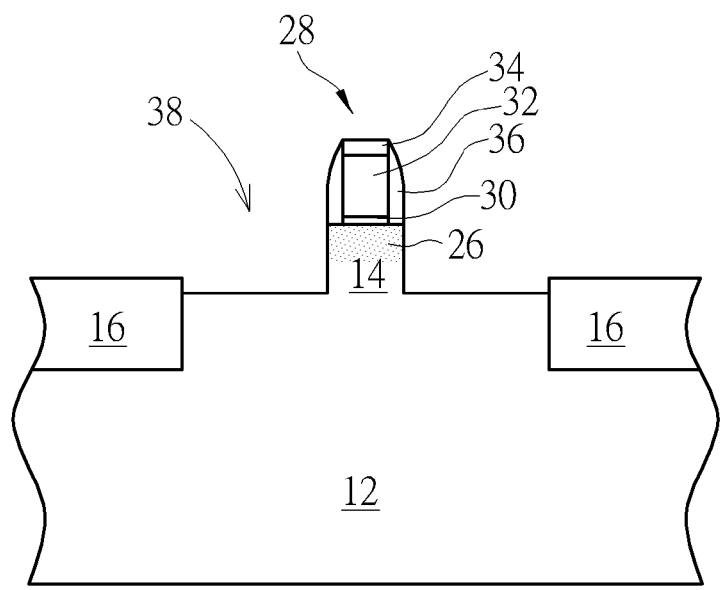

Next, as shown in FIG. 3, a gate structure 28 is formed on the substrate 12 and the fin-shaped structure 14. In this embodiment, the formation of the gate structure 28 could be accomplished by sequentially forming an interfacial layer, a gate material layer, and a hard mask layer on the substrate 12 to cover the fin-shaped structure 14, and then using a patterned mask to remove part of the hard mask layer, part of the gate material layer, and part of the interfacial layer. This forms a gate structure 28 composed of an interfacial layer 30, gate electrode 32, and hard mask 34. In this embodiment, the interfacial layer 30 is preferably a silicon layer composed of $SiO_2$, SiN, or SiON, but could also be composed of high-k dielectric material. The gate electrode 32 is preferably composed of polysilicon, and the hard mask 34 is selected from the group consisting of silicon oxide and silicon nitride.

It should be noted that in order to clearly express the relative location of the lightly doped drain formed thereafter and the gate structure 28, FIG. 3 is preferably a cross-sectional view illustrated along the longer axis of fin-shaped structure 14 while FIGS. 1-2 are cross-sectional views illustrated along the shorter axis of fin-shaped structure 14.

Next, a spacer 36 is formed on the sidewall of the gate structure 28, in which the spacer 36 could be selected from the group consisting of silicon oxide, silicon nitride, silicon oxynitride, and silicon carbon nitride, but not limited thereto. Next, an etching process is conducted to remove part of the fin-shaped structure 14 adjacent to two sides of the spacer 36 for forming a recess 38.

Figure 4:
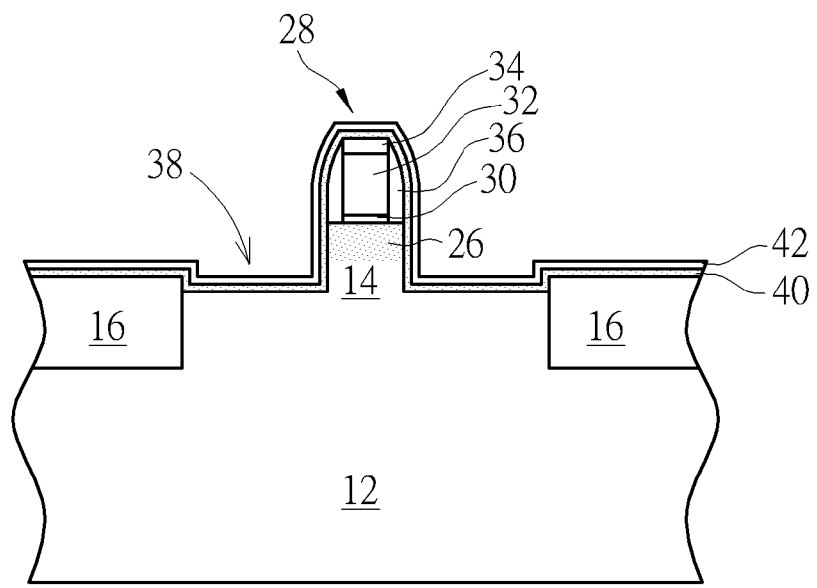

Next, as shown in FIG. 4, another doped layer 40 and a selective liner 42 are formed on the fin-shaped structure 14, STI 16, and gate structure 28 and filled into the recess 38 without filling the recess 38 completely. Similar to the liner 24 and doped layer 22 from FIG. 1, the liner 42 is preferably composed of silicon nitride, and the material of the doped layer 40 could be adjusted depending on the type of transistor being fabricated afterwards. For instance, if a PMOS transistor were to be fabricated, the doped layer 40 is preferably composed of thin film containing p-type dopants, such as borosilicate glass (BSG). Conversely, if a NMOS transistor were to be fabricated, the doped layer 40 is preferably composed of thin film containing n-type dopants, such as phosphosilicate glass (PSG).

Figure 5:
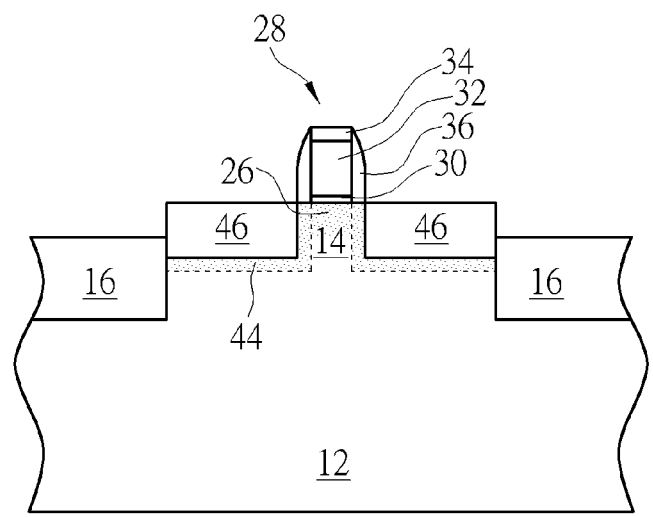

Next, as shown in FIG. 5, an anneal process is conducted to drive dopants within the doped layer 40 into the fin-shaped structure 14 for forming a doped region 44, in which the doped region 44 is preferably serving as a lightly doped drain. After removing the liner 42 and the doped layer 40, an epitaxial layer 46 is formed to fill the recess 38 with in-situ dopants or accompanied by extra ion implantation process to form a source/drain region. Next, standard FinFET fabrication process could be conducted by first forming a contact etch stop layer (CESL) on the fin-shaped structure 14 and the gate structure 28 and forming an interlayer dielectric (ILD) layer (not shown) on the CESL. Next, a replacement metal gate (RMG) process is conducted to planarize part of the ILD layer and CESL and transform the gate structure originally composed of polysilicon material into metal gate. Since the RMG process is well known to those skilled in the art, the details of which are not explained herein for the sake of brevity.

It should be noted that despite two SSD techniques were utilized to adjust threshold voltage and form lightly doped drain in the aforementioned embodiment, including using a doped layer or SSD technique to adjust threshold voltage before formation of gate structure and then using SSD technique again to form lightly doped drain after formation of gate structure, it would also be desirable to conduct either one of the two aforementioned SSD techniques, such as only conducting the SSD technique to adjust threshold voltage before formation of gate structure or only conducting the SSD technique to form lightly doped drain after formation of gate structure, which is also within the scope of the present invention.

Figure 6:
FIGS. 6-13 illustrate a method for fabrication semiconductor device according to a second embodiment of the present invention.
Figure 6:
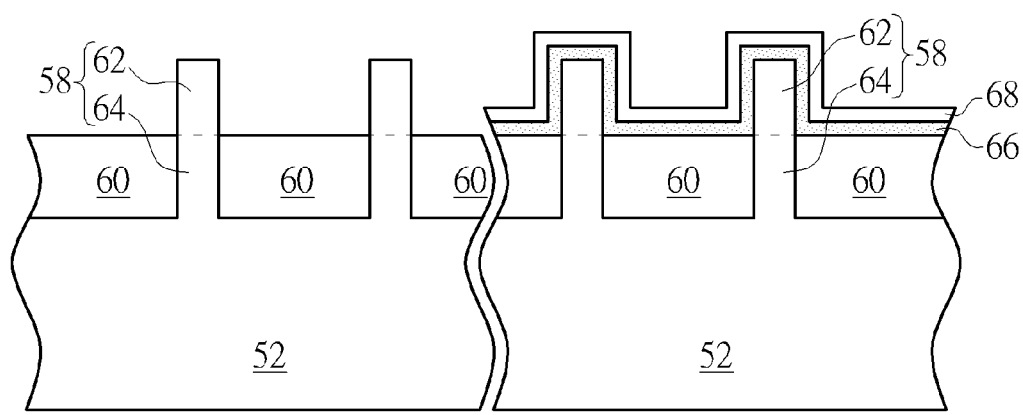

Referring to FIGS. 6-13, FIGS. 6-13 illustrate a method for fabrication semiconductor device according to a second embodiment of the present invention. As shown in FIG. 6, a substrate 52, such as a silicon substrate or SOI substrate is provided, and a NMOS region 54 and a PMOS region 56 are defined on the substrate 52. At least a fin-shaped structure 58 is formed on each of the NMOS region 54 and PMOS region 56 and a STI 60 is formed around the fin-shaped structures 58.

Similar to the aforementioned first embodiment, the formation of the STI 60 could be accomplished by first depositing an insulating material (not shown) composed of silicon oxide on the substrate 52 to cover the fin-shaped structures 58, and a planarizing process such as chemical mechanical polishing (CMP) process is conducted to remove part of the insulating material or even part of the fin-shaped structures 58 so that the top surface of the remaining insulating material is even with the top surface of the fin-shaped structures 58 to form a STI 60. An etching process is then conducted thereafter to remove part of the STI 60 so that the top surface of the STI 60 is slightly lower than the top surface of the fin-shaped structures 58. This divides each of the fin-shaped structures 58 into a top portion 62 and a bottom portion 64, in which the top surface of the STI 60 is even with the bottom surface of the top portions 62 of fin-shaped structures 58 on NMOS region 54 and PMOS region 56. It should also be noted that even though only two fin-shaped structures 58 are formed in each of the NMOS region 54 and PMOS region 56, the quantity of fin-shaped structures 58 could be adjusted according to the demand of the product.

Next, a doped layer 66 and a liner 68 serving as hard mask are formed on the STI 60 and covering the fin-shaped structures 58 on NMOS region 54 and PMOS region 56, in which the liner 68 is preferably composed of silicon nitride and the doped layer 66 is a material layer composed of p-type dopants, such as BSG.

Next, the liner 68 and doped layer 66 are removed from the NMOS region 54 by first forming a patterned resist (not shown) on the PMOS region 56, and then conducting an etching process by using the patterned resist as mask to remove the liner 68 and doped layer 66 on the NMOS region 54 for exposing the STI 60 and top portions 62 of fin-shaped structures 58 underneath.

Figure 7:
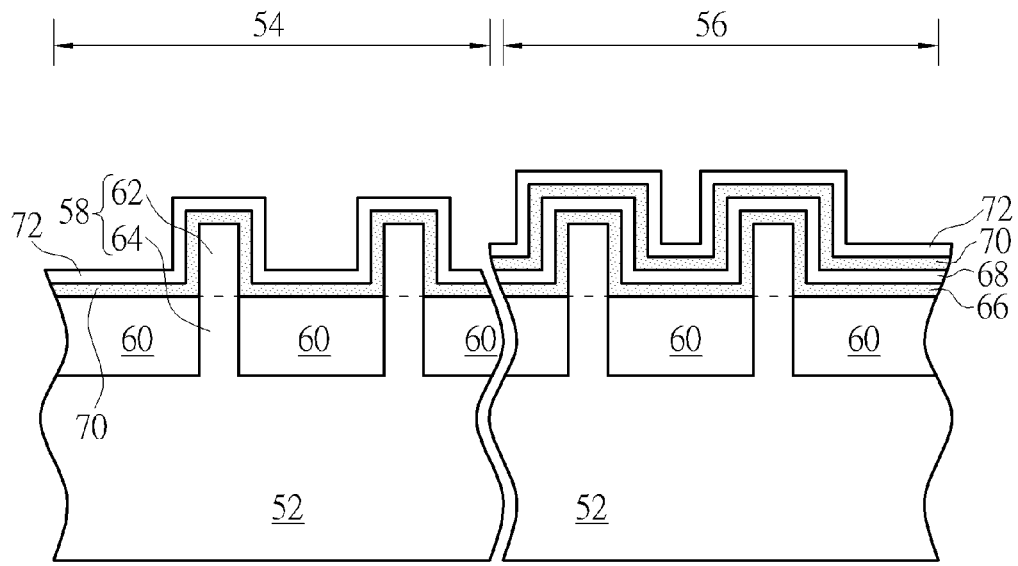

Next, as shown in FIG. 7, a doped layer 70 and a liner 72 serving as hard mask are formed to cover the fin-shaped structures 58 on NMOS region 54 and the liner 68 on PMOS region 56. Preferably, the liner 72 is composed of silicon nitride and the doped layer 70 is a material layer composed of n-type dopants, such as PSG.

Next, an anneal process is conducted to drive the n-type dopants from the doped layer 70 and p-type dopants from the doped layer 66 into the top portions 62 of fin-shaped structures 58 on NMOS region 54 and PMOS region 56 respectively. This forms doped regions (not shown) for adjusting the threshold voltage of the device.

Figure 8:
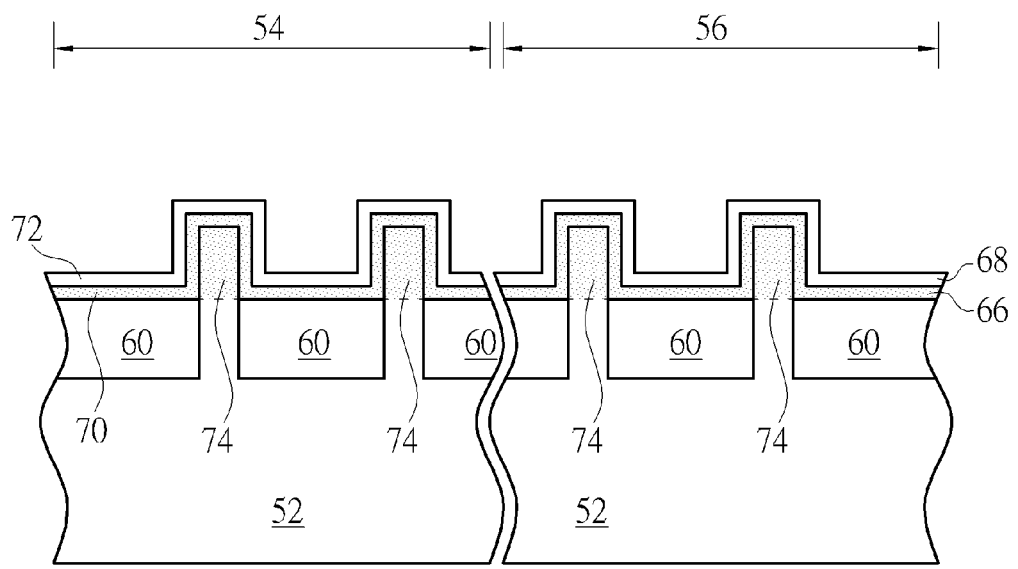

Alternatively, as shown in FIG. 8, it would also be desirable to skip the aforementioned anneal process and first form a patterned resist (not shown) on the NMOS region 54 after doped layer 70 and liner 72 in FIG. 7 are formed, and then conduct an etching process by using the patterned resist as mask to remove the liner 72 and doped layer 70 on PMOS region 56 and expose the liner 68 underneath. An anneal process is conducted thereafter to drive the n-type dopants from doped layer 70 and the p-type dopants from doped layer 66 into the top portions 62 of fin-shaped structures 58 on NMOS region 54 and PMOS region 56 respectively. This forms doped regions 74 for adjusting the threshold voltage of the device.

Figure 9:
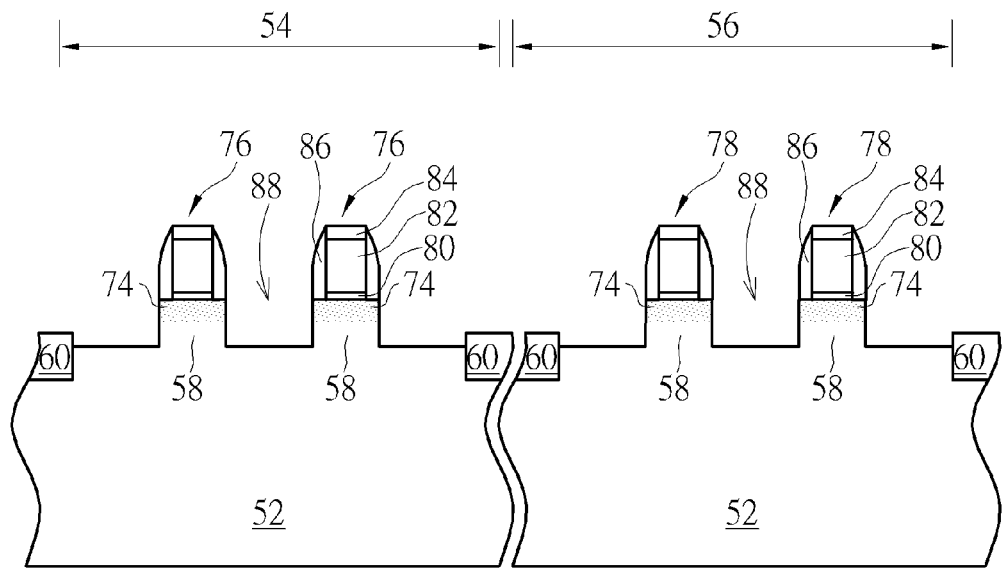

Next, an etching process is conducted to completely remove the liners 68 and 72 and doped layers 66 and 70 from NMOS region 54 and PMOS region 56, and as shown in FIG. 9, gate structures 76 are formed on the fin-shaped structures 58 of NMOS region 54 and gate structures 78 are formed on fin-shaped structures 58 of PMOS region 56. Similar to the aforementioned first embodiment, each of the gate structures 76 and 78 includes an interfacial layer 80, a gate electrode 82, and a hard mask 84. Preferably, the interfacial layer 80 is a silicon layer composed of $SiO_2$, SiN, or SiON, but could also be composed of high-k dielectric material. The gate electrode 82 is preferably composed of polysilicon, and the hard mask 84 is selected from the group consisting of silicon oxide and silicon nitride. Next, spacers 86 are formed on sidewalls of the gate structures 76 and 78, and an etching process is conducted to remove part of the fin-shaped structures 58 adjacent to the spacers 86 for forming recesses 88, in which the spacers 86 could be selected from the group consisting of silicon oxide, silicon nitride, silicon oxynitride, and silicon carbon nitride, but not limited thereto.

Similar to the embodiment shown in FIG. 3, in order to clearly express the relative location of the lightly doped drains formed thereafter and the gate structures 76 and 78, FIG. 9 is preferably a cross-sectional view illustrated along the longer axis of fin-shaped structure 14 while FIGS. 6-8 are cross-sectional views illustrated along the shorter axis of fin-shaped structure 14.

Figure 10:
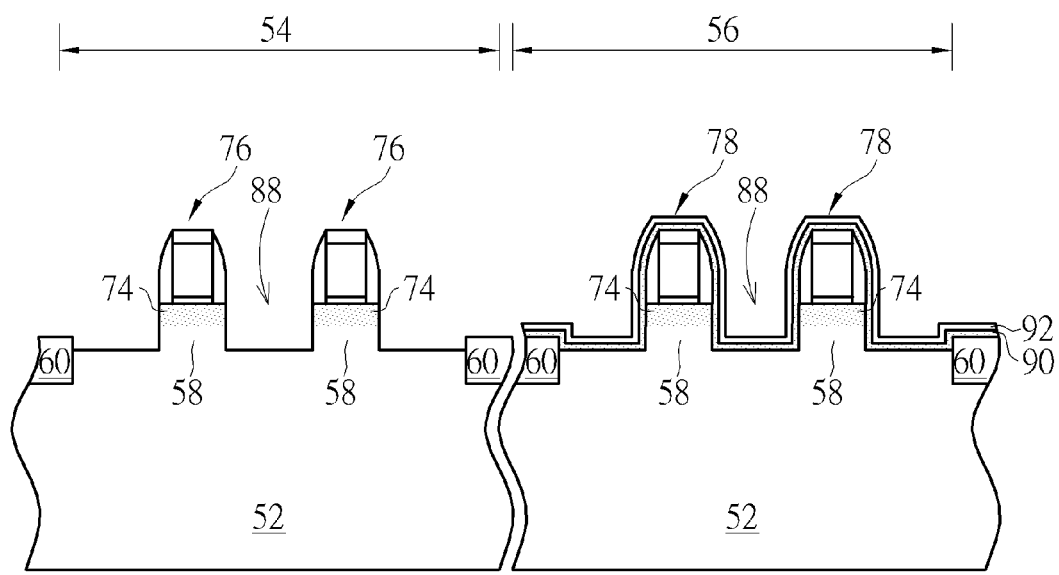

Next, as shown in FIG. 10, another doped layer 90 and a liner 92 are formed on gate structures 76 and 78 of both NMOS region 54 and PMOS region 56 and filled into the recesses 88 without filling the recesses 88 completely. Preferably, the liner 92 is composed of silicon nitride and the doped layer 90 is a material layer composed of p-type dopants such as BSG. Next, the liner 92 and doped layer 90 are removed from the NMOS region 54 by first forming a patterned resist (not shown) on the PMOS region 56, and an etching process is conducted by using the patterned resist as mask to remove the liner 92 and doped layer 90 from the NMOS region 54 and expose the gate structures 76 and recesses 88 on NMOS region 54.

Figure 11:
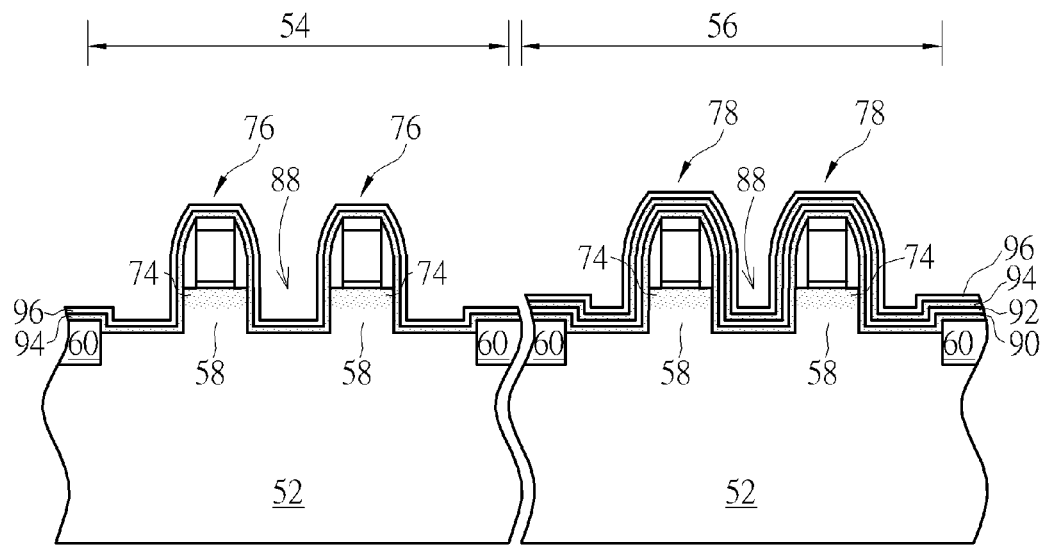

Next, as shown in FIG. 11, a doped layer 94 and a liner 96 are formed sequentially to cover the gate structures 76 on NMOS region 54 and the liner 92 on PMOS region 56. Preferably, the liner 96 is composed of silicon nitride and the doped layer 94 is a material layer composed of n-type dopants such as PSG.

Next, an anneal process is conducted to drive dopants from the doped layers 94 and 90 into the fin-shaped structures 58 adjacent two sides of the gate structures 76 and 78 or fin-shaped structures 58 directly under the recesses 88 on NMOS region 54 and PMOS region 56 for forming doped regions (not shown), in which these doped regions are preferably serving as lightly doped drains for NMOS transistors and PMOS transistors respectively.

Figure 12:
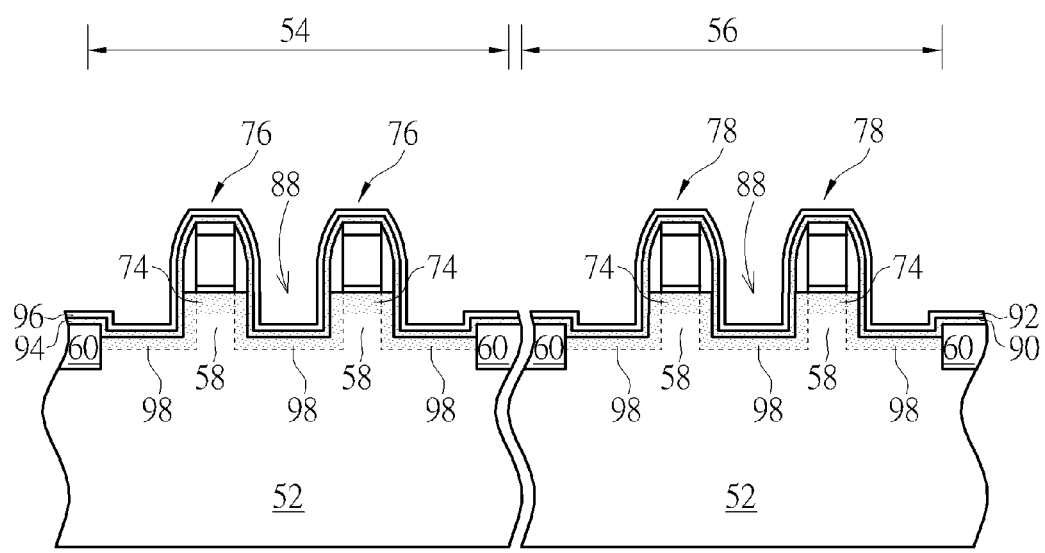

Alternatively, as shown in FIG. 12, it would also be desirable to skip the aforementioned anneal process and first form a patterned resist (not shown) on the NMOS region 54 after doped layer 94 and liner 96 in FIG. 11 are formed, and then conduct an etching process by using the patterned resist as mask to remove the liner 96 and doped layer 94 on PMOS region 56 and expose the liner 92 underneath. An anneal process is conducted thereafter to drive the n-type dopants from doped layer 94 and the p-type dopants from doped layer 90 into the fin-shaped structures 58 adjacent to two sides of the gate structures 76 and 78 or fin-shaped structures 58 under the recesses 88 on NMOS region 54 and PMOS region 56 respectively for forming doped regions 98. Similar to the doped regions formed in FIG. 11, the doped regions 98 are preferably serving as lightly doped drains for NMOS transistors and PMOS transistors.

Figure 13:
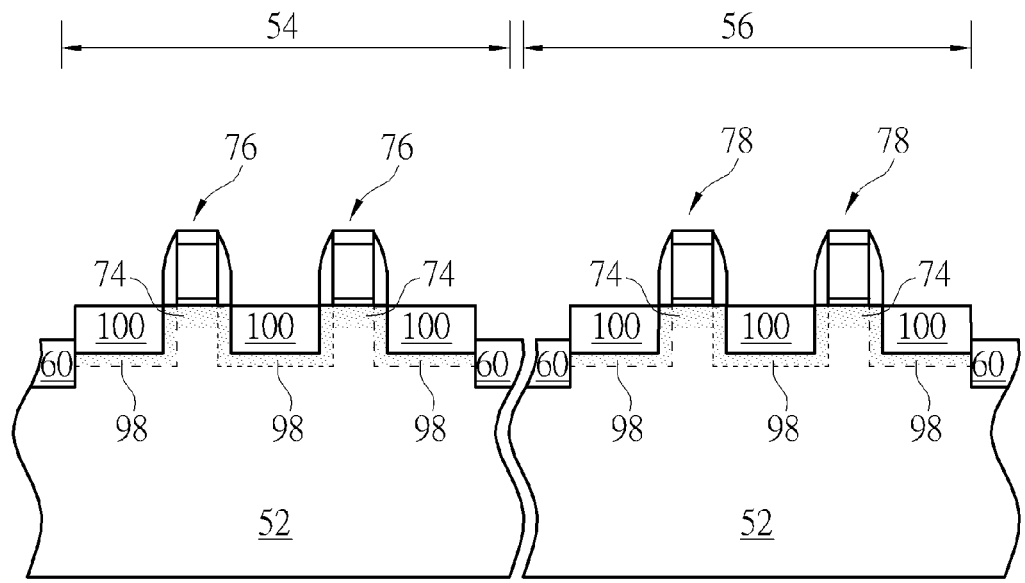

Next, as shown in FIG. 13, after removing the liners 92 and 96 and doped layers 90 and 94 from NMOS region 54 and PMOS region 56, epitaxial layers 100 are formed to fill the recesses 88 with in-situ dopants or accompanied by extra ion implantation process to form source/drain regions on NMOS region 54 and PMOS region 56, in which the epitaxial layer 100 filled in the recesses 88 on NMOS region 54 preferably includes epitaxial material containing n-type dopants such as SiC or SiP, whereas the epitaxial layer 100 filled in the recesses 88 on PMOS region 56 preferably includes epitaxial material such as silicon germanium (SiGe) containing p-type dopants. In this embodiment, the formation of the epitaxial layers 100 could be accomplished by first depositing epitaxial material such as SiGe containing p-type dopants into recesses 88 on both NMOS region 54 and PMOS region 56, forming a cap layer (not shown) composed of silicon nitride on the substrate 12 and gate structures 76 and 78 on NMOS region 54 and PMOS region 56, using a patterned resist (not shown) to remove the cap layer and SiGe on NMOS region 54, depositing epitaxial material such as SiC containing n-type dopants into recesses 88 on NMOS region 54, and finally removing the cap layer on PMOS region 56. This completes the formation of a semiconductor device according to second embodiment of the present invention.

Figure 14:
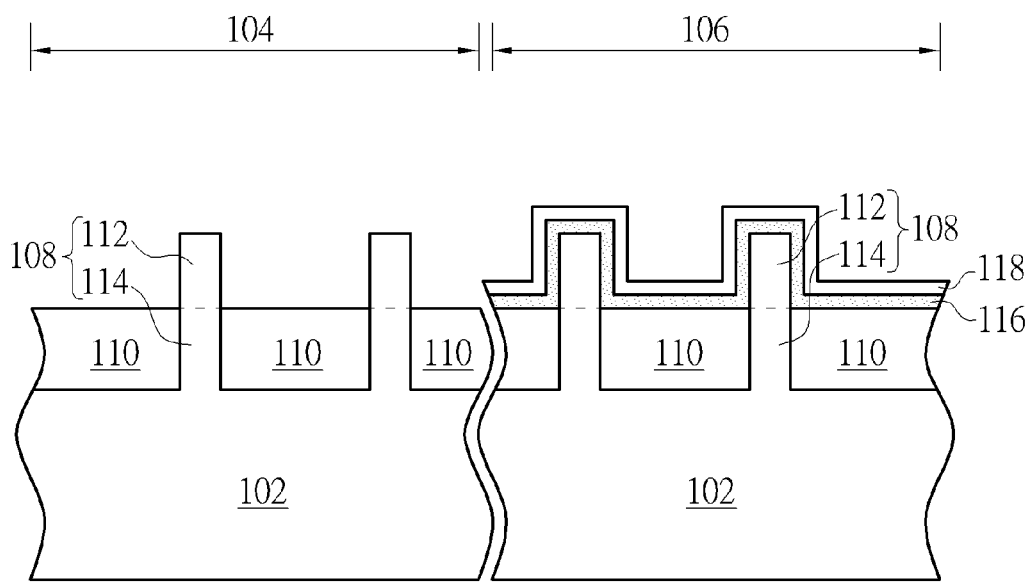
FIGS. 14-16 illustrate a method for fabricating semiconductor device according to a third embodiment of the present invention.
Figure 15:
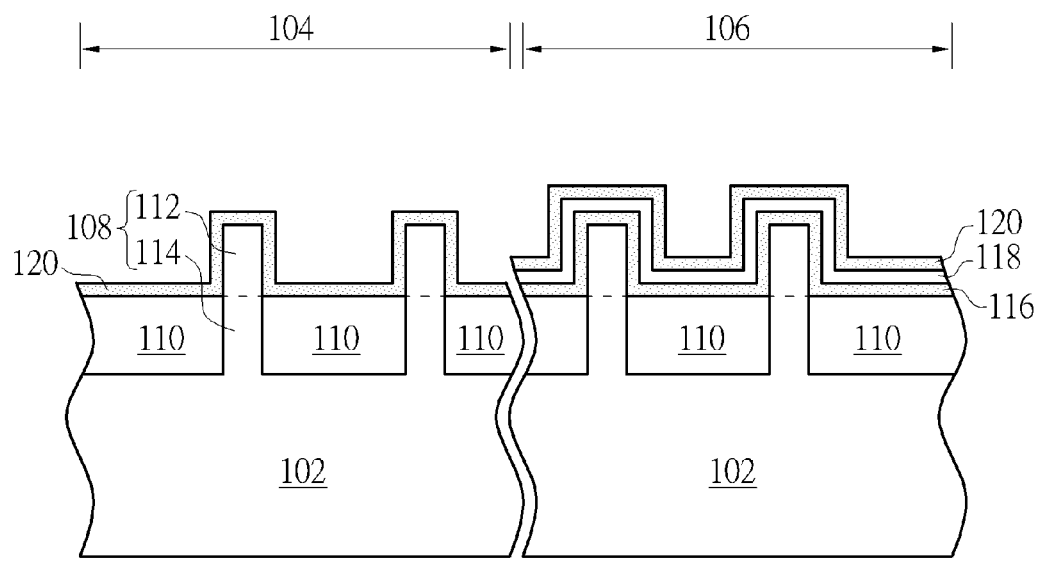
Figure 16:
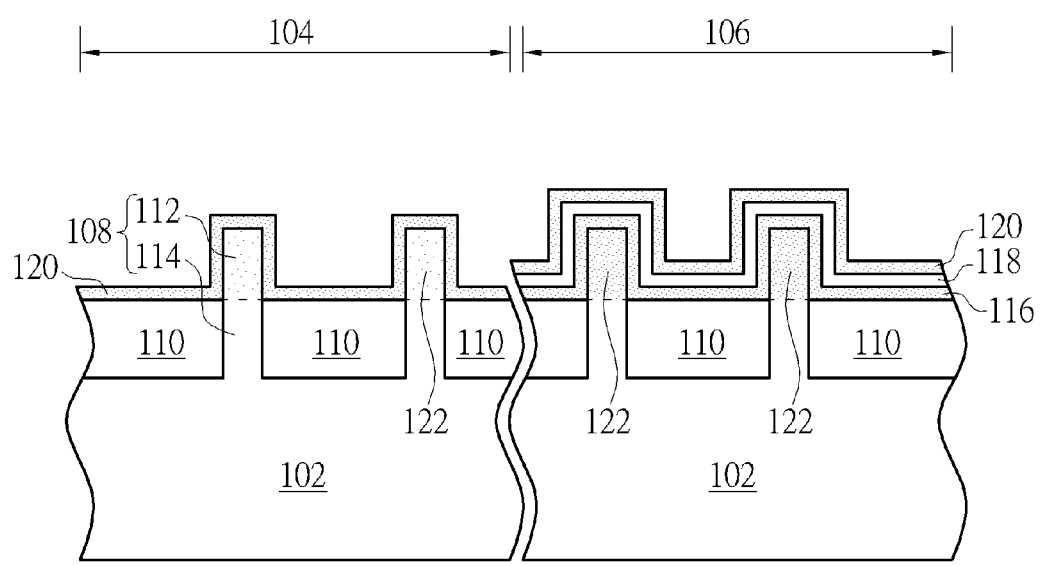

Referring to FIGS. 14-16, FIGS. 14-16 illustrate a method for fabricating semiconductor device according to a third embodiment of the present invention. As shown in FIG. 14, a substrate 102, such as a silicon substrate or SOI substrate is provided, and two transistor regions, such as a first region 104 and a second region 106 are defined on the substrate 12. In this embodiment, the first region 104 and the second region 106 are regions of same conductive type, such as both being PMOS regions or both being NMOS regions, and the first region 104 and second region 106 are defined for forming gate structure having different threshold voltage in the later process. Since this embodiment pertains to the fabrication of PMOS transistors, the first region 104 and second region 106 are both defined as PMOS regions. However, in other embodiment of the present invention, it would also be desirable to define the first region 104 and second region 106 as NMOS regions according to the demand of the product, which is also within the scope of the present invention. Fin-shaped structures 108 are formed on the substrate 102 of the first region 104 and second region 106 respectively, and a STI 110 is formed around the fin-shaped structures 108 on both first region 104 and second region 106.

Similar to the aforementioned first embodiment, the formation of the STI 110 could be accomplished by first depositing an insulating material (not shown) composed of silicon oxide on the substrate 102 to cover the fin-shaped structures 108, and a planarizing process such as chemical mechanical polishing (CMP) process is conducted to remove part of the insulating material or even part of the fin-shaped structures 108 so that the top surface of the remaining insulating material is even with the top surface of the fin-shaped structures 108 to form a STI 110. An etching process is then conducted thereafter to remove part of the STI 110 so that the top surface of the STI 110 is slightly lower than the top surface of the fin-shaped structures 108. This divides each of the fin-shaped structures 108 into a top portion 112 and a bottom portion 114, in which the top surface of the STI 110 is even with the bottom surface of the top portions 112 of fin-shaped structures 108 on first region 104 and second region 106. It should also be noted that even though only two fin-shaped structures 108 are formed in each of the first region 104 and second region 106, the quantity of fin-shaped structures 108 could be adjusted according to the demand of the product.

Next, a doped layer 116 and a liner 118 are formed sequentially on the STI 110 to cover the fin-shaped structures 108 on first region 104 and second region 106. Preferably, the liner 118 is composed of silicon nitride and the doped layer 116 is a material layer composed of p-type dopants, such as BSG.

The liner 118 and doped layer 116 are removed from first region 104 by first forming a patterned resist (not shown) on the second region 106, and an etching process is conducted by using the patterned resist as mask to remove the liner 118 and doped layer 116 on first region 104 to expose the STI 110 and fin-shaped structures 108 underneath.

Next, as shown in FIG. 15, a doped layer 120 and a selective liner (not shown) are formed to cover the fin-shaped structures 108 on first region 104 and the liner 118 on second region 106. Preferably, the doped layers 120 and 116 are composed of dopants of same conductive type, such as both being BSG, and the dopant concentration of the doped layer 116 is preferably larger than the dopant concentration of the doped layer 120. It should be noted that even though both the doped layers 116 and 120 are material layers containing p-type dopants such as BSG, it would also be desirable to adjust the type of dopants being used depend on the demand of the product. For instance, if NMOS transistors were fabricated on the first region 104 and second region 106, the doped layers 116 and 120 containing n-type dopants such as PSG could be used.

Next, as shown in FIG. 16, an anneal process is conducted to drive dopants within the doped layers 116 and 120 into the top portions 112 of fin-shaped structures 108 on first region 104 and second region 106 for forming doped regions 122, and an etching process is conducted to remove the liner 118 and doped layers 116 and 120 from first region 104 and second region 106 completely. This completes the fabrication of a semiconductor device according to a third embodiment of the present invention. It should be noted that since dopants of higher concentration from doped layer 116 are driven into the fin-shaped structures 108 on the second region 106 while dopants of lower concentration from doped layer 120 are driven into the fin-shaped structures 108 on the first region 104, the concentration of the doped regions 122 formed on second region 106 after the anneal process would be higher than the concentration of the doped regions 122 formed on first region 104. In this embodiment, the doped region 122 with higher dopant concentration on second region 106 could be used to fabricate a standard threshold voltage (SVT) gate while the doped region 122 with lower dopant concentration on first region 104 could be used to fabricate a low threshold voltage (LVT) gate in the later processes.

Overall, the present invention discloses an approach of employing solid state doping (SSD) technique on FinFET devices. Preferably, the aforementioned first embodiment and second embodiment not only could use the SSD technique to drive dopants from the doped layer into the top portion of fin-shaped structure for adjusting threshold voltage and resolving issues such as uneven dopant distribution caused by conventional ion implantation technique, but also could similar SSD technique to form doped regions serving as lightly doped drains in the fin-shaped structure adjacent to the gate structure. Moreover, the third embodiment of the present invention applies similar SSD technique to form doped regions with same conductive type but different dopant concentration on different regions of fin-shaped structure. This allows the formation of gate structures suitable for different threshold voltages in the later process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a first fin-shaped structure on the first region and a second fin-shaped structure on the second region;
   forming a shallow trench isolation (STI) around the first fin-shaped structure and the second fin-shaped structure so that each of the first fin-shaped structure and the second fin-shaped structure is divided into a top portion and a bottom portion;
   forming a first doped layer on the STI and on the top portion of the second fin-shaped structure;
   forming a second doped layer on the STI and the top portion of the first fin-shaped structure, wherein the first doped layer and the second doped layer comprise dopants of same type; and
   performing an anneal process.

2. The method of claim 1, further comprising:
   forming the first doped layer and a first liner on the STI, the first fin-shaped structure, and the second fin-shaped structure;
   removing the first liner and the first doped layer from the first region;
   forming the second doped layer on the STI, the first fin-shaped structure, and the first liner; and
   performing the anneal process.

3. The method of claim 1, wherein the dopant concentration of the first doped layer is higher than the dopant concentration of the second doped layer.

4. The method of claim 1, wherein the first doped layer and the second doped layer comprise borosilicate glass (BSG).

5. The method of claim 1, wherein the first doped layer and the second doped layer comprise phosphosilicate glass (PSG).

* * * * *